US012768875B2

(12) United States Patent
Yang et al.

(10) Patent No.: US 12,768,875 B2
(45) Date of Patent: Oct. 20, 2026

(54) ELECTRICAL TESTING FOR PANEL CHARACTERIZATION AND DEFECT SCREENING

(71) Applicant: Apple Inc., Cupertino, CA (US)

(72) Inventors: Xuebei Yang, Fremont, CA (US); Chung-Lun E Hsu, San Jose, CA (US); Cheuk Chi Lo, Belmont, CA (US); Hasan Akyol, Los Altos, CA (US); Yingkan Lin, San Jose, CA (US); John T Wetherell, San Jose, CA (US); Han Zhao, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 191 days.

(21) Appl. No.: 18/656,567

(22) Filed: May 6, 2024

(65) Prior Publication Data

US 2024/0402237 A1 Dec. 5, 2024

Related U.S. Application Data

(60) Provisional application No. 63/470,040, filed on May 31, 2023.

(51) Int. Cl.
*G01R 31/26* (2020.01)
*H10P 74/20* (2026.01)

(52) U.S. Cl.
CPC ........ *G01R 31/2635* (2013.01); *H10P 74/203* (2026.01)

(58) Field of Classification Search
CPC .......................... G01R 31/2635; H10P 74/203
USPC ......................... 324/500, 600, 76.11, 762.07
See application file for complete search history.

(56) References Cited

U.S. PATENT DOCUMENTS

| | | | | |
|---|---|---|---|---|
| 7,868,856 | B2 | 1/2011 | Fish | |
| 7,928,936 | B2 | 4/2011 | Levey et al. | |
| 8,791,939 | B2 | 7/2014 | Odawara et al. | |
| 10,115,356 | B2 * | 10/2018 | Endo | G09G 3/006 |
| 10,269,110 | B2 * | 4/2019 | Forutanpour | G06T 7/0004 |
| 10,964,238 | B2 | 3/2021 | Pappas et al. | |
| 10,996,258 | B2 | 5/2021 | Chaji et al. | |
| 11,579,182 | B1 | 2/2023 | Brodoceanu et al. | |
| 2007/0080905 | A1 * | 4/2007 | Takahara | G09G 3/3258 345/76 |

(Continued)

*Primary Examiner* — Giovanni Astacio-Oquendo
*Assistant Examiner* — Trung Q Nguyen
(74) *Attorney, Agent, or Firm* — Fletcher Yoder, PC

(57) ABSTRACT

Systems and methods are provided for electrical testing to supplement or replace optical testing of an electronic display. Internal testing circuitry that includes analog front end (AFE) and analog-to-digital converter (ADC) circuitry may be included in the electronic display and may be used either alone or in combination with other testing devices to perform electrical characterization and defect screening. The electrical characterization and defect screening may be performed before or after self-emissive elements such as light-emitting diodes are installed, further improving yield. Types of electrical characterization and defect screening may include a partial passive mode electrical characterization of OLEDs, vertical or horizontal crosstalk measurement, scan line integrity testing, pixel bright dot testing, display pixel defect detection, and delayed defect detection for defects that may occur after some extended period of time (e.g., after several minutes, after several hours).

25 Claims, 14 Drawing Sheets

(56) References Cited

U.S. PATENT DOCUMENTS

| | | | | |
|---|---|---|---|---|
| 2007/0290710 | A1* | 12/2007 | Chuang | G02F 1/136259<br>324/760.01 |
| 2008/0284760 | A1* | 11/2008 | Brunner | G09G 3/006<br>345/204 |
| 2010/0295860 | A1* | 11/2010 | Somerville | G09G 3/3216<br>345/545 |
| 2014/0329339 | A1* | 11/2014 | Chaji | G09G 3/006<br>438/10 |
| 2018/0204492 | A1* | 7/2018 | Kuo | G09G 3/20 |
| 2019/0073955 | A1* | 3/2019 | Zou | G09G 3/3258 |
| 2023/0017885 | A1 | 1/2023 | Zhu et al. | |

* cited by examiner

ELECTRICAL TESTING FOR PANEL CHARACTERIZATION AND DEFECT SCREENING

CROSS-REFERENCE TO RELATED APPLICATIONS

This application claims priority to U.S. Provisional Application No. 63/470,040, filed May 31, 2023, which is incorporated by reference herein in its entirety.

SUMMARY

The present disclosure generally relates to electronic displays and, more particularly, to electrical testing to characterize components of an electronic display or to electrically screen defects.

Numerous electronic devices—such as computers, mobile phones, portable media devices, tablets, televisions, virtual-reality headsets, and vehicle dashboards, among many others—include electronic displays. To display an image, an electronic display controls the light emission of its display pixels based on corresponding image data for the display pixels. By emitting light in various brightness values at different display pixels according to the image data, the electronic display may present an image.

Electronic displays include numerous components with behaviors that may vary from device to device. As such, the components an electronic display may be characterized during manufacturing or design to better control the components of the electronic display, as well as to identify any defects that may be present. Many of these tests are optical tests in which the electronic display is programmed using specific image patterns while a sensitive, high-resolution camera observes the resulting light that is emitted (or not emitted) by the display pixels of the electronic display. While optical testing may effectively be used to characterize the display pixels and identify defects, there may be drawbacks to optical testing. For example, optical testing may involve specialized equipment in a suitably controlled environment to prevent light interference from other light sources. Moreover, optical testing cannot begin until light-emitting parts of the electronic display have been installed.

Electrical testing may supplement or replace optical testing during the design or manufacturing phases of electronic display production. Internal testing circuitry that includes analog front end (AFE) and analog-to-digital converter (ADC) circuitry may be included in the electronic display and may be used either alone or in combination with other testing devices to perform electrical characterization and defect screening. In some cases, the electrical characterization and defect screening may be performed before self-emissive elements are installed (e.g., before micro-LEDs are placed or before organic light emitting diodes (OLEDs) are deposited) on the electronic display, further improving yield. Types of electrical characterization and defect screening may include a partial passive mode electrical characterization of OLEDs, vertical or horizontal crosstalk measurement, scan line integrity testing, pixel bright dot testing, display pixel defect detection, and delayed defect detection for defects that may occur after some extended period of time (e.g., after several minutes, after several hours).

BRIEF DESCRIPTION OF THE DRAWINGS

Various aspects of this disclosure may be better understood upon reading the following detailed description and upon reference to the drawings described below.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Figure 1:
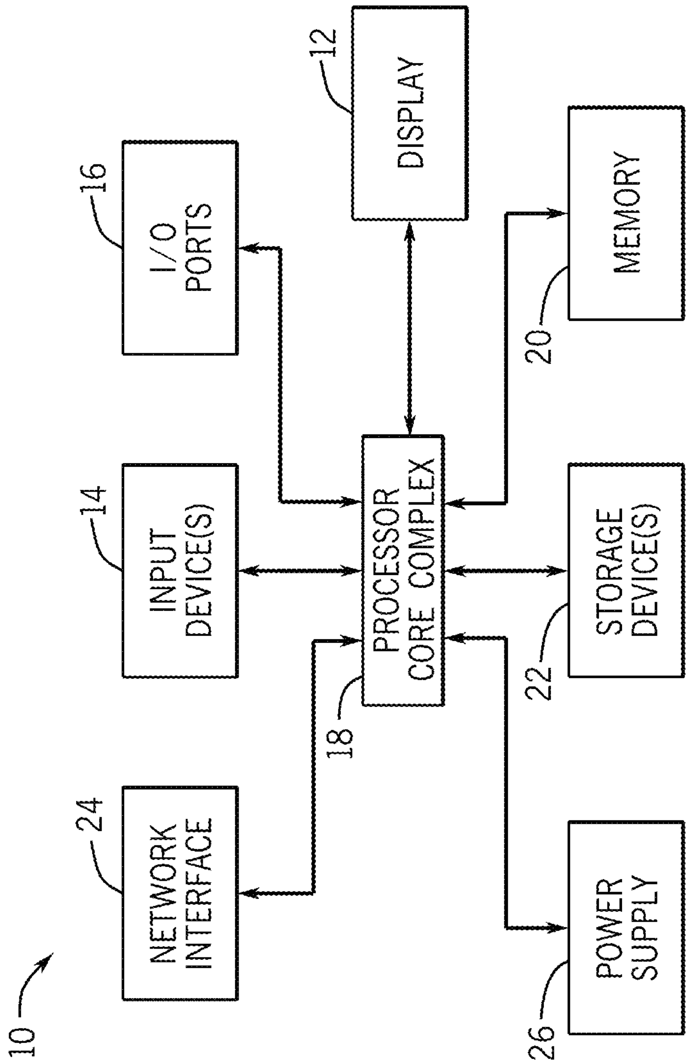
FIG. 1 is a block diagram of an electronic device with an electronic display.

An electronic device 10 including an electronic display 12 is shown in FIG. 1. As is described in more detail below, the electronic device 10 may be any suitable electronic device, such as a computer, a mobile phone, a portable media device, a tablet, a television, a virtual-reality headset, a wearable device such as a watch, a vehicle dashboard, or the like. Thus, it should be noted that FIG. 1 is merely one example of a particular implementation and is intended to illustrate the types of components that may be present in an electronic device 10.

The electronic device 10 includes the electronic display 12, one or more input devices 14, one or more input/output (I/O) ports 16, a processor core complex 18 having one or more processing circuitry(s) or processing circuitry cores, local memory 20, a main memory storage device 22, a network interface 24, and a power source 26 (e.g., power supply). The various components described in FIG. 1 may include hardware elements (e.g., circuitry), software elements (e.g., a tangible, non-transitory computer-readable medium storing executable instructions), or a combination of both hardware and software elements. It should be noted that the various depicted components may be combined into fewer components or separated into additional components. For example, the local memory 20 and the main memory storage device 22 may be included in a single component.

The processor core complex 18 is operably coupled with local memory 20 and the main memory storage device 22. Thus, the processor core complex 18 may execute instructions stored in local memory 20 or the main memory storage device 22 to perform operations, such as generating or transmitting image data to display on the electronic display 12. As such, the processor core complex 18 may include one or more general purpose microprocessors, one or more application specific integrated circuits (ASICs), one or more field programmable logic arrays (FPGAs), or any combination thereof.

In addition to program instructions, the local memory 20 or the main memory storage device 22 may store data to be processed by the processor core complex 18. Thus, the local memory 20 and/or the main memory storage device 22 may include one or more tangible, non-transitory, computer-readable media. For example, the local memory 20 may include random access memory (RAM) and the main memory storage device 22 may include read-only memory (ROM), rewritable non-volatile memory such as flash memory, hard drives, optical discs, or the like.

The network interface 24 may communicate data with another electronic device or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, or a wide area network (WAN), such as a 4G, Long-Term Evolution (LTE), or 5G cellular network. The power source 26 may provide electrical power to one or more components in the electronic device 10, such as the processor core complex 18 or the electronic display 12. Thus, the power source 26 may include any suitable source of energy, such as a rechargeable lithium polymer (Li-poly) battery or an alternating current (AC) power converter. The I/O ports 16 may enable the electronic device 10 to interface with other electronic devices. For example, when a portable storage device is connected, the I/O port 16 may enable the processor core complex 18 to communicate data with the portable storage device.

The input devices 14 may enable user interaction with the electronic device 10, for example, by receiving user inputs via a button, a keyboard, a mouse, a trackpad, or the like. The input device 14 may include touch-sensing components in the electronic display 12. The touch sensing components may receive user inputs by detecting the occurrence or position of an object touching the surface of the electronic display 12.

The electronic display 12 may include a display panel with an array of display pixels. The electronic display 12 may control light emission from the display pixels to present visual representations of information, such as a graphical user interface (GUI) of an operating system, an application interface, a still image, or video content, by displaying frames of image data. To display images, the electronic display 12 may include display pixels implemented on the display panel. The display pixels may represent sub-pixels that each control a luminance value of one color component (e.g., red, green, or blue for an RGB pixel arrangement or red, green, blue, or white for an RGBW arrangement).

The electronic display 12 may display an image by controlling light emission from its display pixels based on image data associated with corresponding display pixels in the image. In some embodiments, image data may be generated by an image source, such as the processor core complex 18 (e.g., a central processing unit (CPU) and/or a graphics processing unit (GPU)), or an image sensor. Additionally, in some embodiments, image data may be received from another electronic device 10, for example, via the network interface 24 and/or an I/O port 16. Similarly, the electronic display 12 may display image data generated by the processor core complex 18, or the electronic display 12 may display image data received via the network interface 24, an input device, or an I/O port 16.

Figure 2:
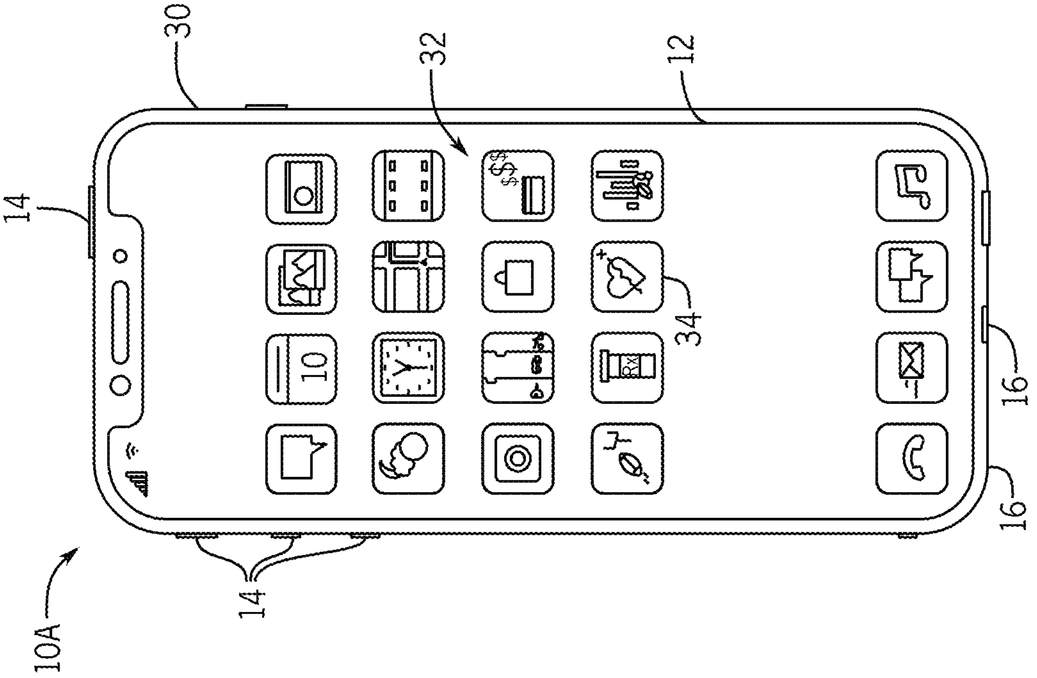
FIG. 2 is a front view of a handheld device representing an example of the electronic device of FIG. 1.

The electronic device 10 may be any suitable electronic device. To help illustrate, an example of the electronic device 10, a handheld device 10A, is shown in FIG. 2. The handheld device 10A may be a portable phone, a media player, a personal data organizer, a handheld game platform, or the like. For illustrative purposes, the handheld device 10A may be a smart phone, such as any iPhone® model available from Apple Inc.

The handheld device 10A includes an enclosure 30 (e.g., housing). The enclosure 30 may protect interior components from physical damage or shield them from electromagnetic interference, such as by surrounding the electronic display 12. The electronic display 12 may display a graphical user interface (GUI) 32 having an array of icons. When an icon 34 is selected either by an input device 14 or a touch-sensing component of the electronic display 12, an application program may launch.

The input devices 14 may be accessed through openings in the enclosure 30. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, or toggle between vibrate and ring modes.

Figure 3:
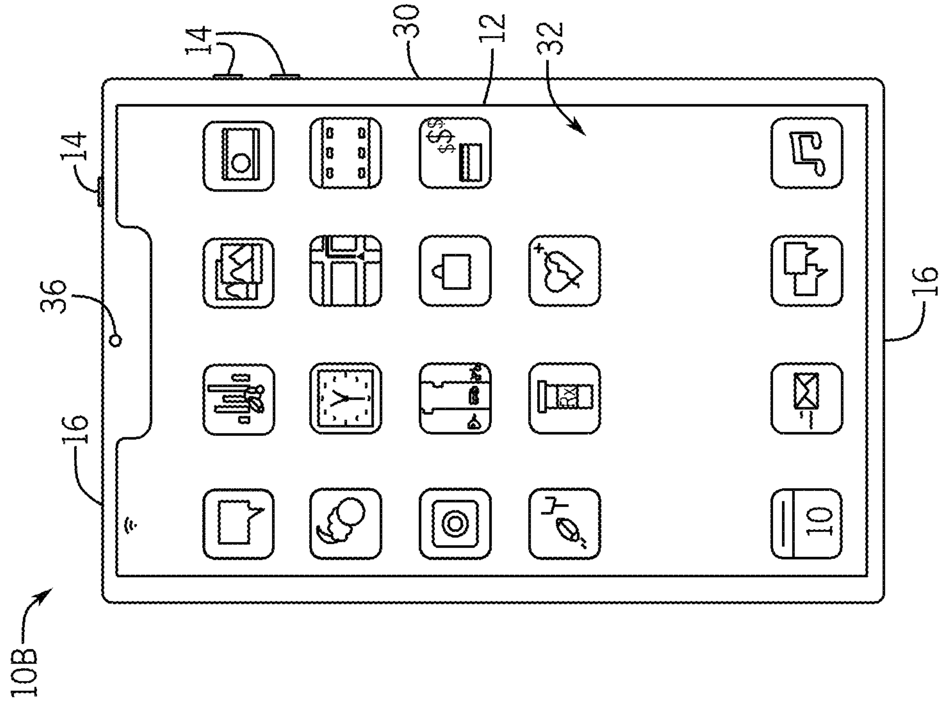
FIG. 3 is a front view of another handheld device representing another example of the electronic device of FIG. 1.
Figure 4:
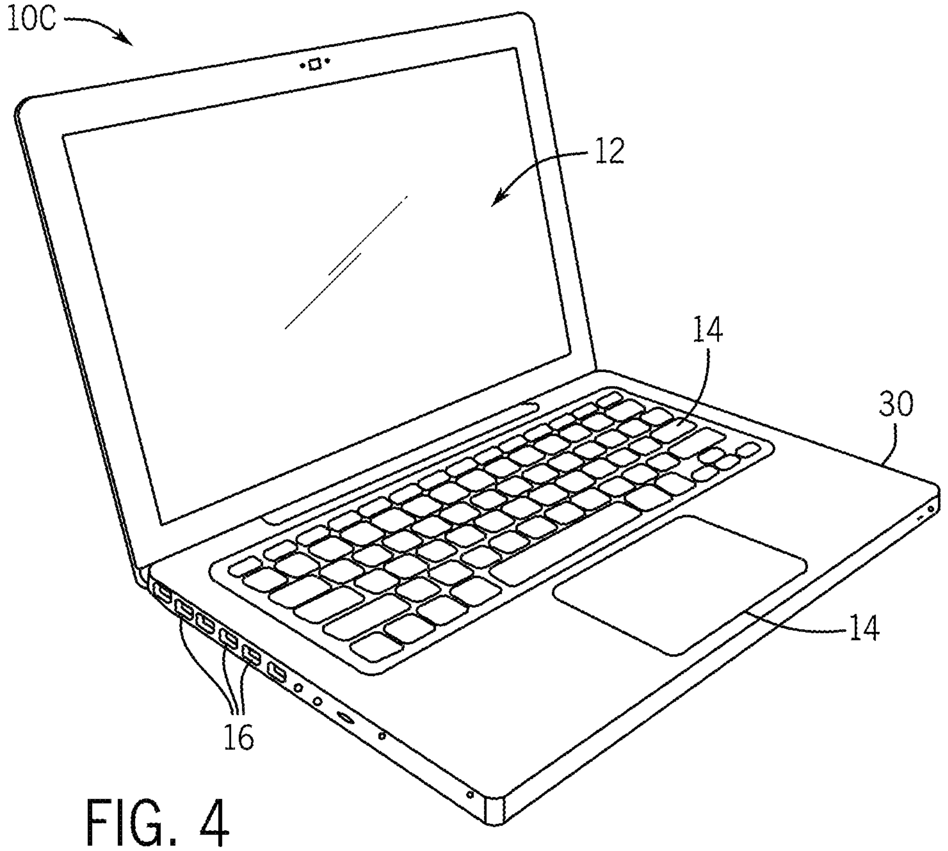
FIG. 4 is a perspective view of a notebook computer representing an example of the electronic device of FIG. 1.
Figure 5:
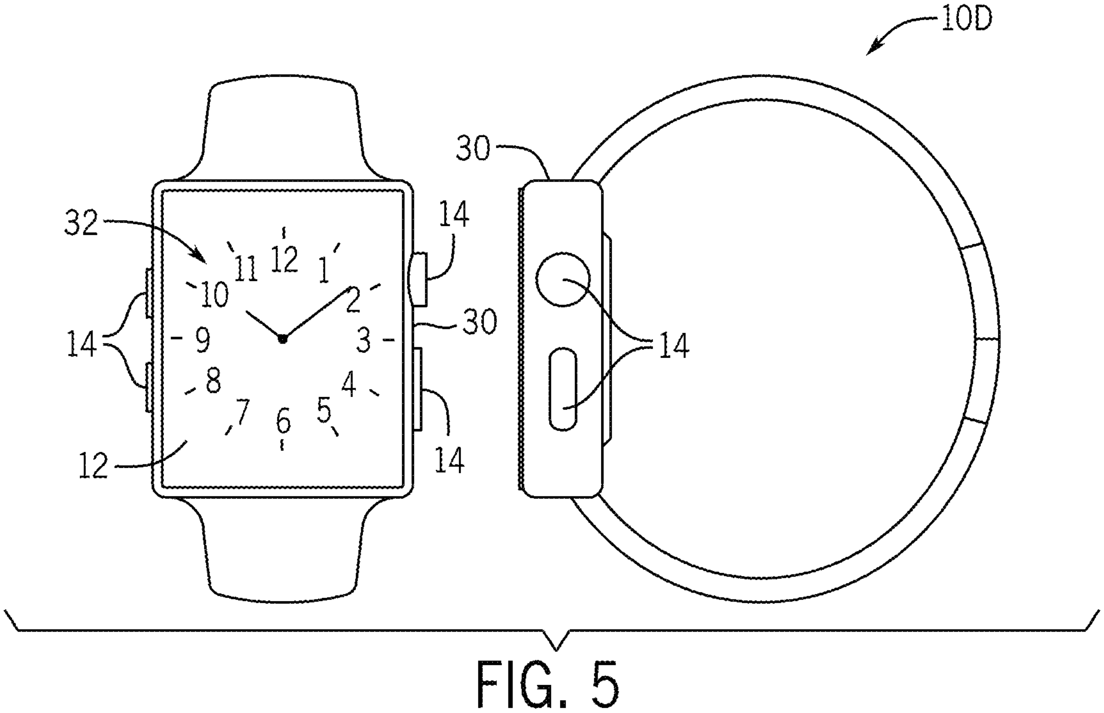
FIG. 5 illustrates front and side views of a wearable electronic device representing another example of the electronic device of FIG. 1.

Another example of a suitable electronic device 10, specifically a tablet device 10B, is shown in FIG. 3. The tablet device 10B may be any iPad® model available from Apple Inc. A further example of a suitable electronic device 10, specifically a computer 10C, is shown in FIG. 4. For illustrative purposes, the computer 10C may be any MacBook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 30. The electronic display 12 may display a GUI 32. Here, the GUI 32 shows a visualization of a clock. When the visualization is selected either by the input device 14 or a touch-sensing component of the electronic display 12, an application program may launch, such as to transition the GUI 32 to presenting the icons 34 discussed with respect to FIGS. 2 and 3.

Figure 6:
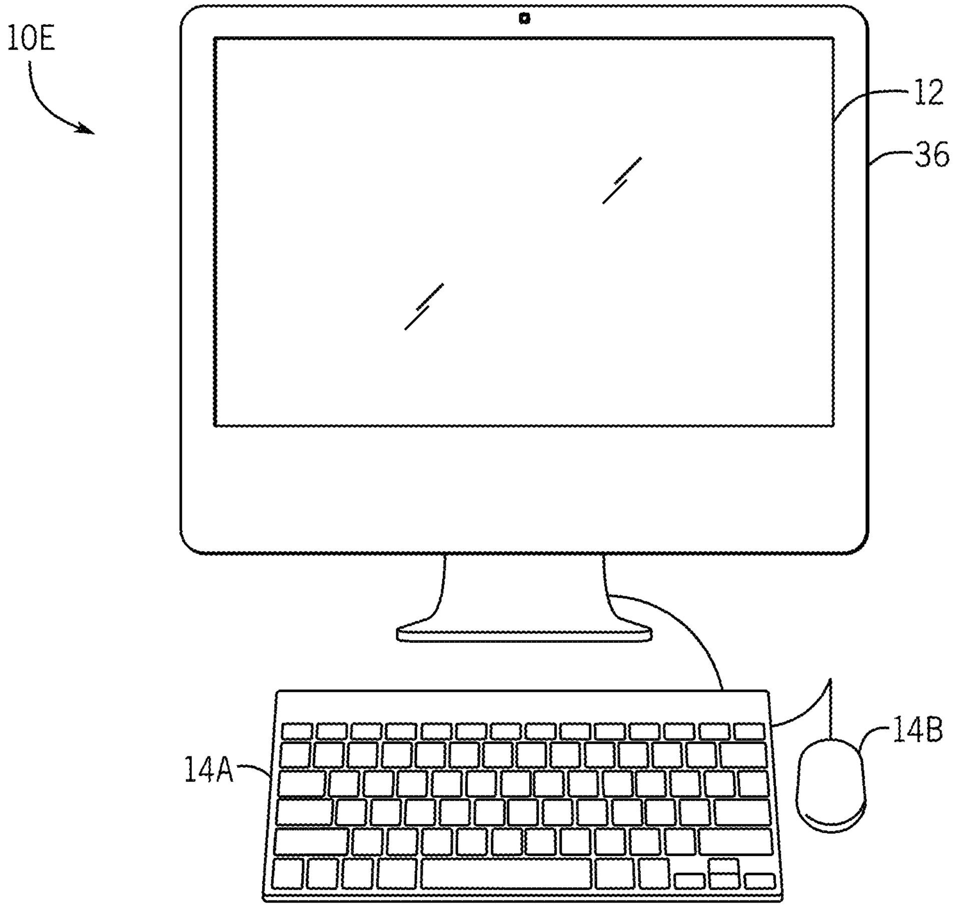
FIG. 6 is a front view of a desktop computer representing another embodiment of the electronic device of FIG. 1.

Turning to FIG. 6, a computer 10E may represent another embodiment of the electronic device 10 of FIG. 1. The computer 10E may be any computer, such as a desktop computer, a server, or a notebook computer, but may also be a standalone media player or video gaming machine. By way of example, the computer 10E may be an iMac®, a MacBook®, or other similar device by Apple Inc. of Cupertino, California. It should be noted that the computer 10E may also represent a personal computer (PC) by another manufacturer. A similar enclosure 36 may be provided to protect and enclose internal components of the computer 10E, such as the electronic display 12. In certain embodiments, a user of the computer 10E may interact with the computer 10E using various peripheral input devices 14, such as the keyboard 14A or mouse 14B (e.g., input devices 14), which may connect to the computer 10E.

Figure 7:
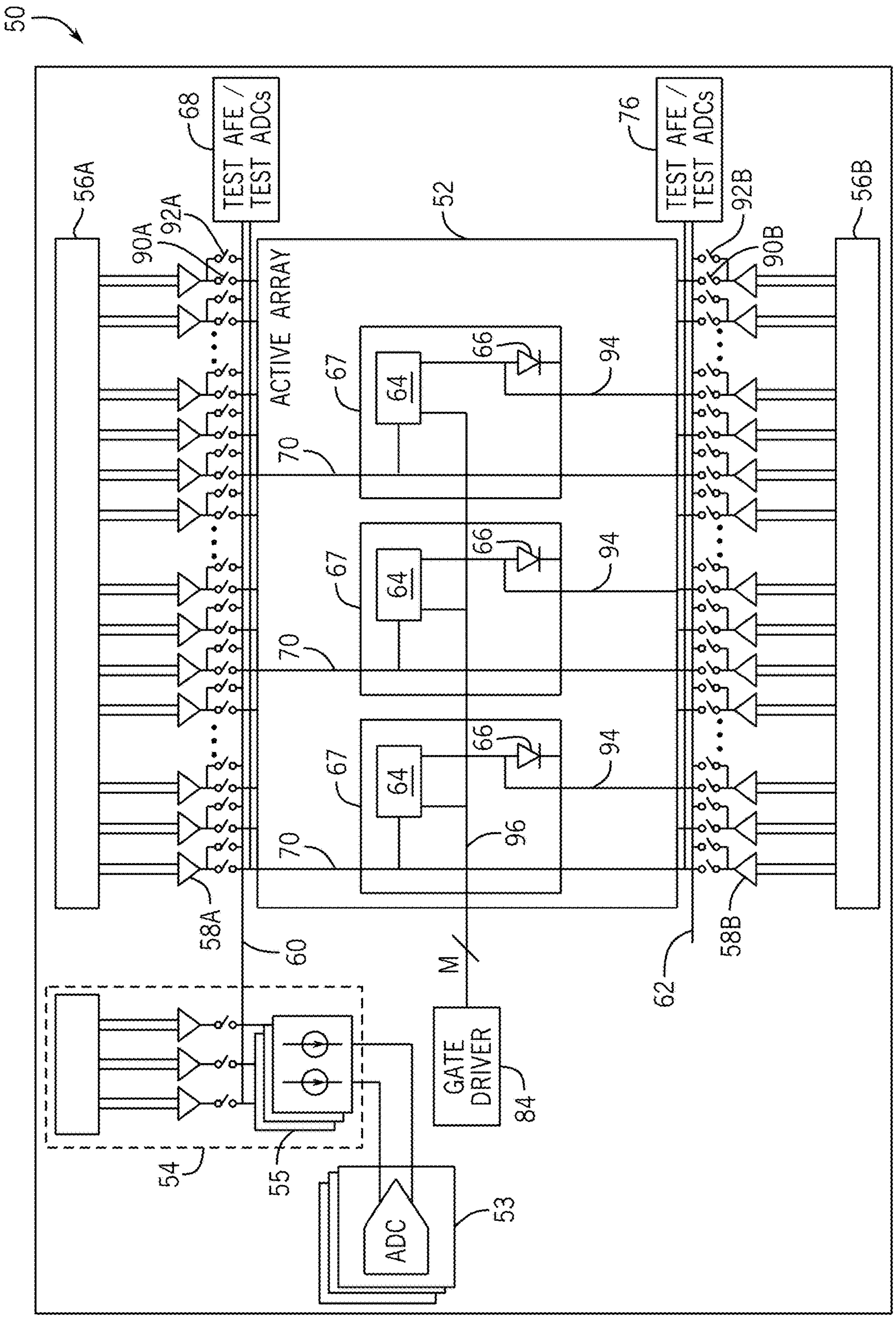
FIG. 7 is a block diagram of a system with test architecture for display sensing and testing.

FIG. 7 is a block diagram of a system 50 for display sensing and testing, according to an embodiment of the present disclosure. The system 50 may be included in the electronic display 12 of the electronic device 10 discussed with respect to FIG. 1. The system 50 includes an active array 52 (e.g., active area) and a reference array 54 that may be sampled by a reference analog-to-digital converter (ADC) 53. The reference array 54 includes a number of reference pixels 55. The reference array 54 may be used to test and track an operation of the reference pixels 55, which may be used to calibrate the display pixels 67 of the active array 52. As illustrated, the display pixels 67 of the active array 52 may include pixel circuitry 64 and a self-emissive element 66 such as an organic light-emitting diode (OLED), a micro-OLED, or a micro-light-emitting diode (μ-LED). Based on the operation of the reference pixels 55, one or more parameters (e.g., a current, an output luminance, etc.) of the corresponding pixels 67 of the active array 52 may be adjusted. The pixel circuitry 64 of the pixel 67 may be tested with or without the self-emissive elements 66 installed in the active array 52. This may allow the circuitry of the active array 52 to be tested to ensure proper operation before the self-emissive elements 66 are installed.

The active array 52 includes a number of pixels 67 arranged in a matrix. The processor core complex 18, discussed with respect to FIG. 1, may provide image data to the display pixels 67 via driver circuitry such as one or more source drivers 58A, 58B via data lines 70 and one or more gate drivers 84 that activate a row of pixels 67 using a gate signal over a gate line 96. The one or more source drivers 58A, 58B and the one or more gate drivers 84 may be coupled to a respective pixel 67 via pixel circuitry 64 to activate or illuminate a self-emissive element 66 (e.g., an OLED) based on image data. In some embodiments, the one or more gate drivers 84 may also provide reset, on-bias stress, and/or pixel activation signals to the display pixels 67, to prepare the display pixels 67 to receive data via the source drivers 58A, 58B. A source latch 56A, 56B is coupled to each of the source drivers 58A, 58B. The source latch 56A, 56B may provide image data to each of the source drivers 58A, 58B to cause each pixel 67 to illuminate at a brightness level corresponding to the image data.

Each source driver 58A, 58B may couple to a test bus 60, 62 via a respective test switch 92A, 92B to provide a signal to test circuitry 68, 76. The test circuitry 68, 76 may include an analog front end (AFE) and/or an analog to digital converter (ADC). That is, an analog signal may be received by the test circuitry 68, 76 via the test bus and converted by the ADC into a digital signal during testing. During normal operation of the system 50, a state of the test switches 92A, 92B may be open such that the source drivers 58A, 58B are decoupled from the test bus 60, 62. During certain types of testing, a state of the test switches 92A, 92B may be changed to closed such that the source drivers 58A, 58B are coupled to the test bus 60, 62. The test switches 92A, 92B enable testing of one, all, or some combination of the source drivers 58A, 58B simultaneously.

Thus, the test switches 92A, 92B enable isolation of one or more source drivers 58A, 58B to be tested. In some embodiments, a data switch 90A, 90B may be disposed between and coupled to the source drivers 58A, 58B and the pixel circuitry 64. During normal operation, the data switches 90A, 90B may be in a closed state such that the source drivers 58A, 58B are coupled to the pixel circuitry 64 of the display pixels 67. During a testing operation, the data switches 90A, 90B may be in an opened state.

The test buses 60, 62 are coupled to the test circuitry 68, 76. The signal provided to the test circuitry 68, 76 by the source drivers 58A, 58B may be a voltage or current that would otherwise be provided to respective pixel circuitry 64. The test circuitry 68, 76 may include various components, such as multiplexers and/or switches, to receive one or more signals from the source drivers 58A, 58B, the gate drivers 84, the pixel circuitry 64, data lines 70 between the source drivers 58A, 58B and the pixel circuitry 64, reset signal lines 94 that may carry an anode reset signal from the source drivers 58A, 58B to an anode of the self-emissive element 66, or the like. For each pixel 67, the test circuitry 68, 76 may determine whether a defect exists in a respective source driver 58A, 58B, a respective gate driver 84, respective pixel circuitry 64, a data line between the respective source driver 58A, 58B and the respective pixel circuitry 64, or the like based at least in part on the one or more signals.

Figure 8:
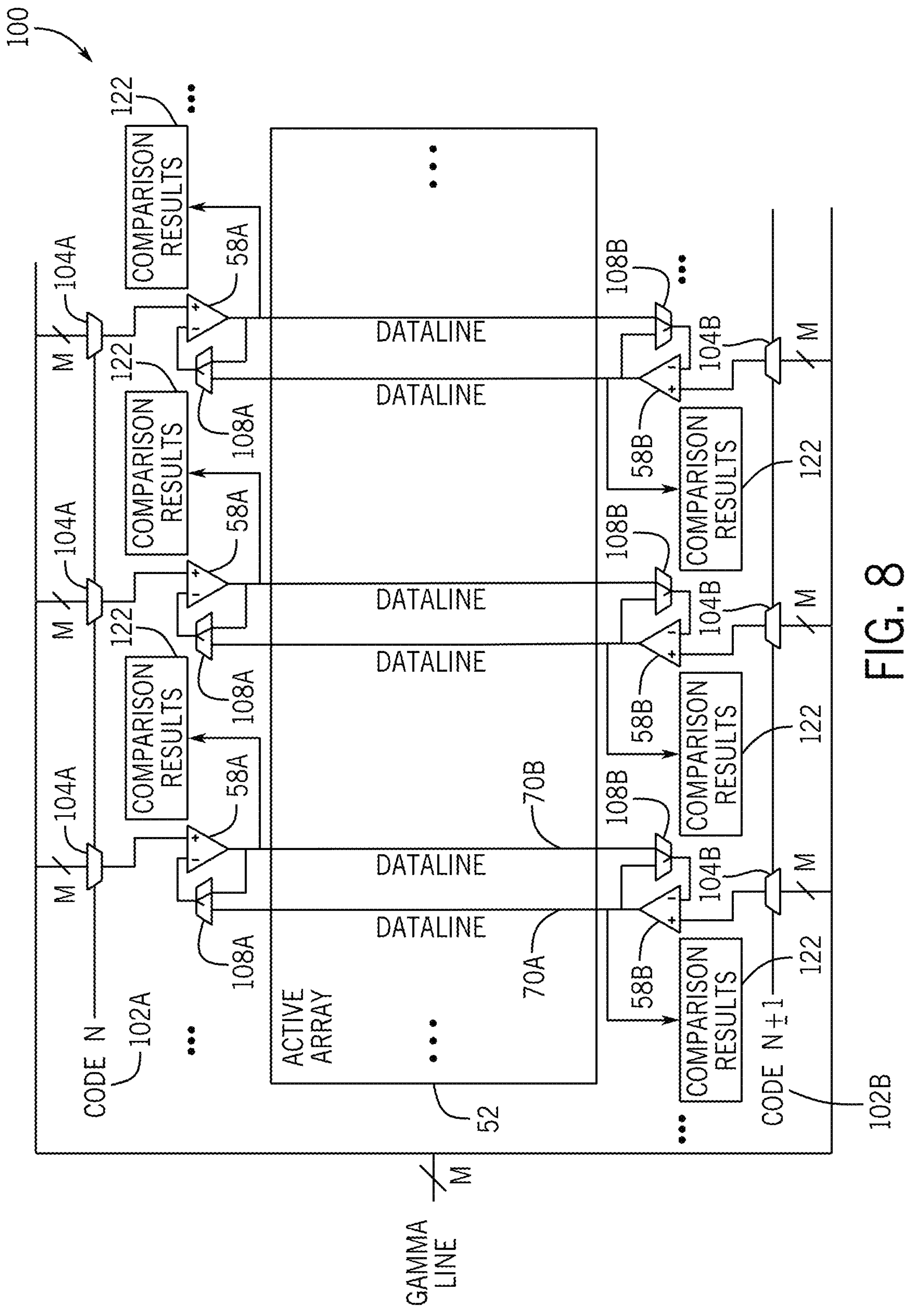
FIG. 8 is a block diagram of an example architecture for screening source drivers of a display.

FIG. 8 is a block diagram of an example architecture 100 for screening source drivers of a display. FIG. 8 represents one specific way in which the system 50 may be used to perform electrical testing. The architecture 100 includes a number of source drivers 58A, 58B coupled to a number of multiplexers 104A, 104B, 108A, 108B. In some embodiments, the source driver 58A, 58B may correspond to the source drivers 58A, 58B, respectively, discussed with respect to FIG. 7.

An input signal (e.g., gamma) may be provided to the source drivers 58A, 58B via the multiplexers 104A, 104B. The multiplexers 104A may provide the input signal to the first source drivers 58A and the multiplexers 104B provide the input signal to the second source drivers 58B, based on respective code lines 102A, 102B. In some embodiments, first multiplexers 108A and second multiplexers 108B are switches that route an output of at least some of the pluralities of source drivers 58A, 58B to a corresponding opposite source driver 58B or 58A.

To test a number of first source drivers 58A and corresponding data lines 112, a corresponding number of second source drivers 58B may function as voltage comparators. Respective first multiplexers 108A are switched such that outputs from respective second source drivers 58B are provided to a controller 122. For example, the second source drivers 58B may be coupled to receive the input signal and coupled to respective data lines 112 of the first source drivers 58A. In that case, the first multiplexers 108A may provide feedback to the first source drivers 58A from the data line 112. The second source drivers 58B may receive and compare the input signal from the multiplexers 104B and a signal from the first source drivers 58A via the data line 112. The second source drivers 58B provide a comparison result to the controller 122. The comparison by the second multiplexers 108B may be performed for each of the first source drivers 58A regardless of whether the input signal is received. That is, the comparison may be performed to ensure the input signal is provided to the data line 112 and/or to ensure the data line 112 is not shorted.

A similar configuration may be used to test the second source drivers 58B and corresponding data lines 110. In that case, the second multiplexers 108B may provide feedback to the second source drivers 58B. The first multiplexers 108A may receive and compare the input signal from the multiplexers 104A and a signal from the second source drivers 58B via the data line 110. The first source drivers 58A provide the comparison result to the controller 122.

Although not shown, the data lines 70A, 70B may be coupled to one or more pixels of the electronic display 12, such as the display pixels 67 discussed with respect to FIG. 7. That is, the architecture 100 may be used to test the source drivers 58A, 58B with or without the pixels installed in the display. In this way, the architecture 100 can be tested during manufacturing which reduces downtime to correct an issue with the source drivers 58A, 58B and the data lines 70A, 70B. Testing before the self-emissive elements 66 are installed in the electronic display 12 can also reduce voltage degradation of the self-emissive elements 66 during testing.

Electrical testing may be controlled by any suitable data processing circuitry, which may be part of the electronic display, part of an electronic device when the electronic display is installed into that electronic device, or may be part of a testing device. Indeed, the flowcharts of the methods discussed below may be performed at least in part using any such suitable data processing circuitry. In some cases, instructions stored on any suitable tangible, non-transitory, machine-readable media that, when executed by a data processing system that includes one or more processors, may carry out the methods discussed in this disclosure.

Partial Passive Mode Electrical Characterization

Once the self-emissive elements 66 have been installed on the active array 52 (e.g., after OLED deposition), the self-emissive elements 66 may be characterized by determining the efficiency of the self-emissive elements 66 by identifying characteristic (e.g., average, typical) current-voltage (IV) curves of the display pixels 67. Instead of, or in addition to, an optical test, the characterization may be done electrically using the system 50 of FIG. 7. What is more, the electrical characterization may take place using a partial passive mode. In a full passive mode, all of the display pixels 67 of a particular color may be tested at once. While this may provide a full sample of the IV curves for those self-emissive elements 66, the total amount of electrical current could become excessive, particularly as electronic displays grow larger. As such, a partial passive mode may instead be employed to obtain characteristic IV curves of the self-emissive elements 66 without testing all self-emissive elements 66 of a particular color at once.

Figure 9:
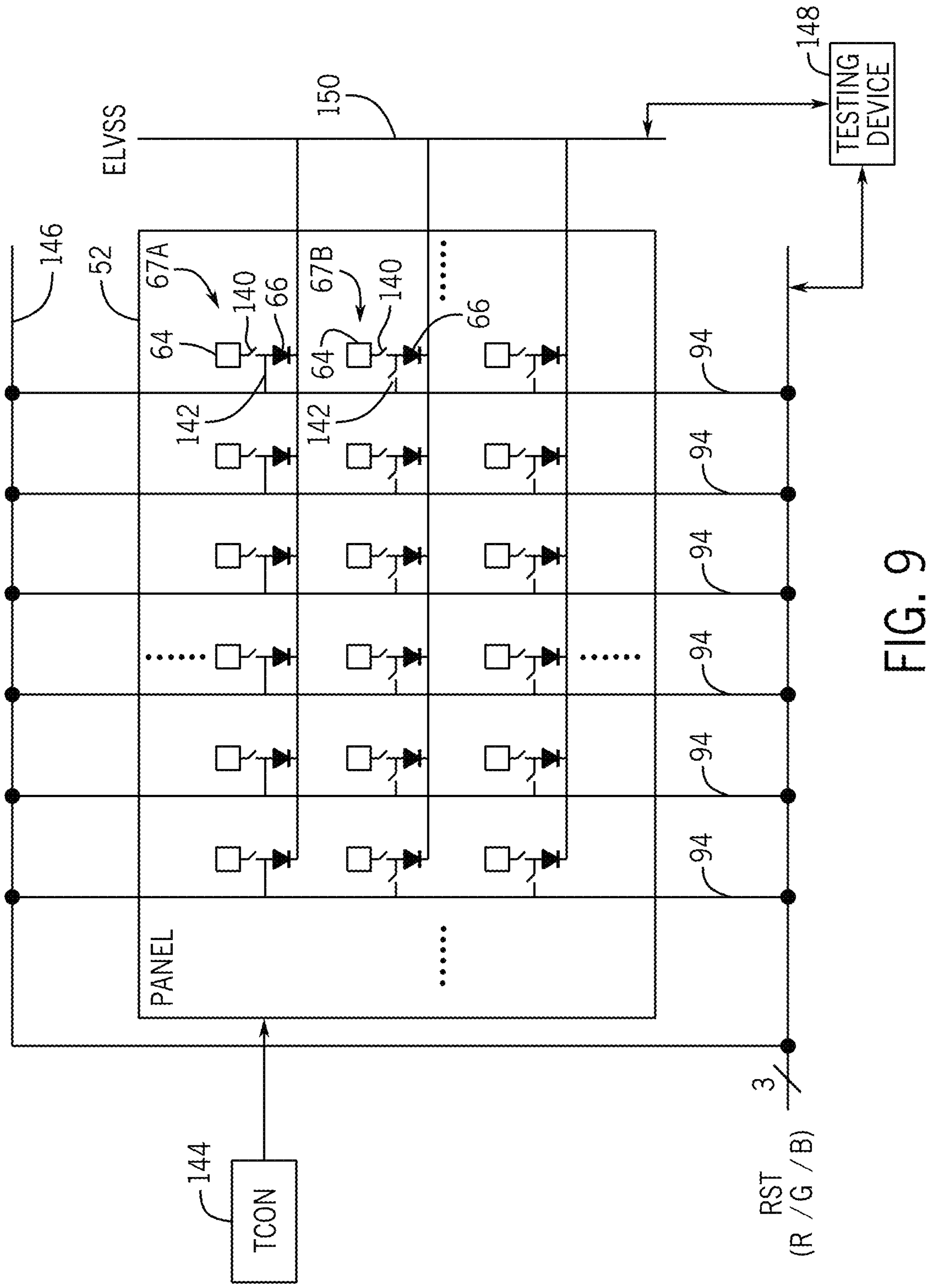
FIG. 9 is a block diagram illustrating the use of the test architecture in a partial passive mode to perform OLED current-voltage (IV) characterization.

Partial passive mode electrical characterization may take advantage of the discrete control provided by the system 50. By way of example, in FIG. 9, two display pixels 67A and 67B are illustrated on two different rows of the active array 52. In the display pixel 67A, a switch 140 is disconnected between the pixel circuitry 64 that drives the self-emissive elements 66 and the self-emissive elements 66. An anode reset switch 142 is connected. This allows the display pixel 67A and all other display pixels 67 of the same row as the display pixel 67A to be tested. In the display pixel 67B, the switch 140 and the switch 142 are both disconnected. Thus, the display pixel 67B may not be tested while the display pixel 67A is being tested. A timing controller (TCON) 144 may cause (e.g., by sending signals to display driver circuitry that controls the active array 52) the switches to open and close as desired to perform the partial passive mode testing. A test signal 146 of a desired voltage from a test voltage supply (e.g., source drivers 58 of the electronic display or a testing device 148) may be provided over anode reset lines 94 to the anodes of self-emissive elements 66 that are selected based on the switches 142 that are closed. A testing device 148 may measure the cumulative current that exits through the cathodes of the self-emissive elements 66 under test (e.g., at a negative supply voltage (e.g., ELVSS) 150). The testing device 148 may represent any suitable electrical measurement device (e.g., current meter, multimeter) that may measure the cumulative current and may or may not be part of or coupled to a computing device. In one example, the testing device 148 may include or may couple to processing circuitry (e.g., processor, memory) to compute a characteristic IV curve for the self-emissive elements 66 of the electronic display based on the test signals 146 that are applied and the output currents that result.

Figure 10:
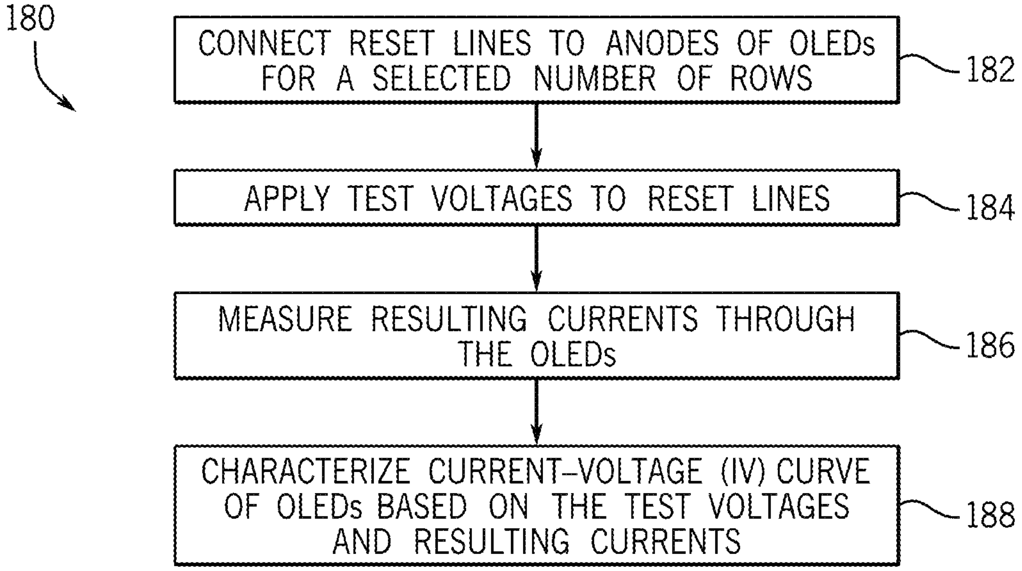
FIG. 10 is a flowchart of a method for using the test architecture in a partial passive mode to perform OLED current-voltage (IV) characterization.

For example, as shown in a flowchart 180 of FIG. 10, the reset lines 94 may be selectively connected to the anodes of self-emissive elements (e.g., OLEDs) that are to be tested (block 182) and test voltages (e.g., a sweep of voltages from zero to a maximum voltage of the electronic display) may be applied (block 184). The resulting currents passing through the self-emissive elements (e.g., OLEDs) may be measured (block 186). Based on the values of the test voltages and resulting electrical currents, a characteristic IV curve may be obtained (block 188). The flowchart 180 may be performed at least once for each display pixel color on the electronic display (e.g., once to characterize red display pixels, once to characterize green display pixels, and once to characterize blue display pixels). Moreover, the more test voltages applied, the more discrete the characterization that may be obtained.

Any suitable number of rows of self-emissive elements may be tested at block 182. For example, 5% of all rows, 10% of all rows, 15% of all rows, 20% of all rows, or some other number of rows may be selected. The selected rows may be adjacent (e.g., 300 middle rows) or distributed across the electronic display (e.g., 100 rows at the top of the electronic display, 100 rows in the middle of the electronic display, and 100 rows at the bottom of the electronic display; every other row; every third row; every $10^{th}$ row; every $30^{th}$ row). Moreover, the number of rows under test may change based on the test voltages being applied. For example, when the test voltage is relatively low, more rows may be selected. This is because the resulting current per self-emissive element is also low, allowing for a higher cumulative current to be sensed by the testing device. When the test voltage is relatively higher, fewer rows may be selected to avoid overpowering the testing device with excessive current beyond the sensitivity of the testing device.

Electrical Measurement of Panel Crosstalk

Even before the self-emissive elements 66 are installed, vertical or horizontal crosstalk due to data lines coupling with other electrical components of the electronic display may be measured electrically. Indeed, excessive crosstalk may indicate a defect that may be corrected or may cause the display panel to be discarded, thereby avoiding installation of self-emissive elements 66 on a defective device (and thereby improving the final yield). Vertical crosstalk describes an electrical pixel current shift when a data line couples to a different driving node. Vertical crosstalk may result in an image artifact of a vertical optical line after self-emissive elements have been installed. Horizontal crosstalk describes an electrical pixel current shift when a data line couples to reference voltages. Horizontal crosstalk may result in an image artifact of a horizontal optical line after self-emissive elements have been installed. As such, it is beneficial to identify vertical or horizontal crosstalk before installing the self-emissive elements.

Figure 11:
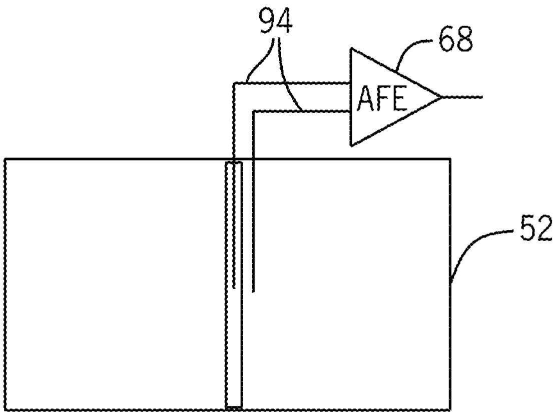
FIG. 11 is a diagram of a first test pattern used to identify vertical crosstalk.
Figure 12:
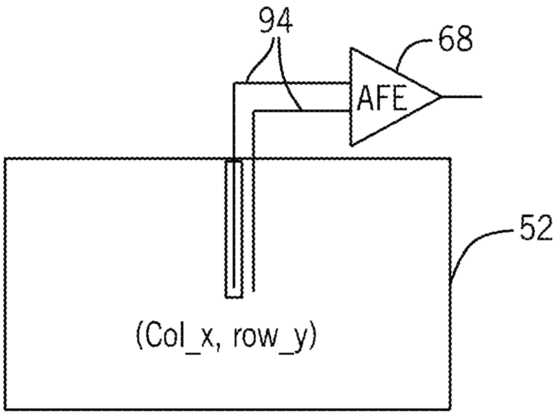
FIG. 12 is a diagram of a second test pattern used to identify vertical crosstalk.
Figure 13:
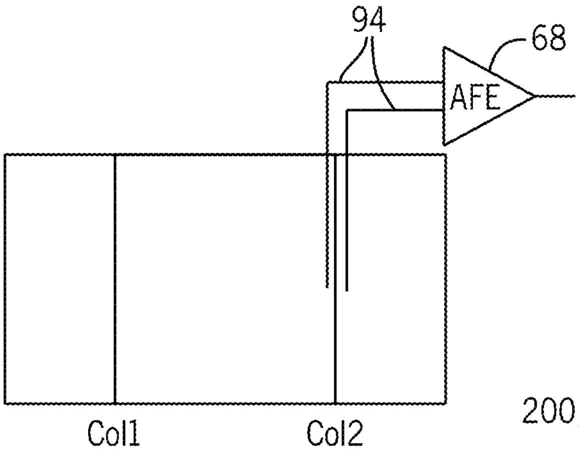
FIG. 13 is a diagram of a first test pattern used to identify horizontal crosstalk.
Figure 14:
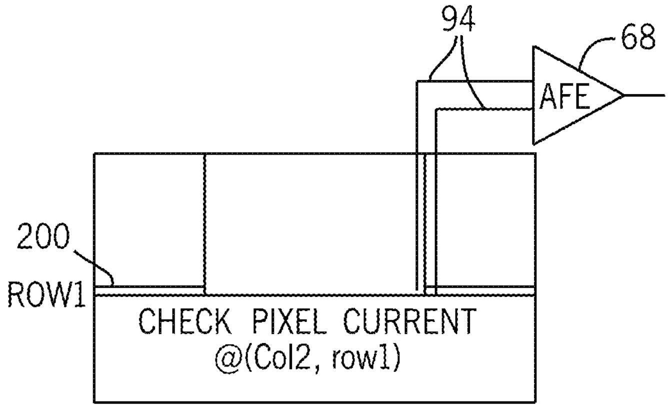
FIG. 14 is a diagram of a second test pattern used to identify horizontal crosstalk.
Figure 15:
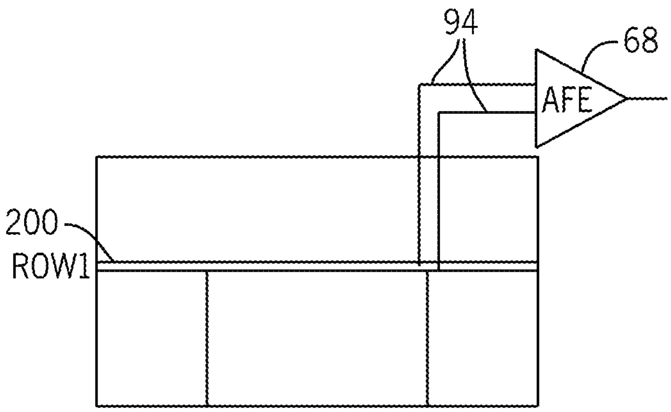
FIG. 15 is a diagram of a third test pattern used to identify horizontal crosstalk.

Vertical crosstalk may be tested by programming the active area of the electronic display using the patterns shown in FIGS. 11 and 12 and horizontal crosstalk may be tested by programming the active area of the electronic display using the patterns shown in FIGS. 13-15. In FIGS. 11-15, reset lines 94 are used to sense the pixel current from a pixel, a row of pixels, or a column of pixels using test circuitry 68 (here shown as an analog front end (AFE)). Black parts of the active array 52 represent display pixels that are programmed with a voltage corresponding to a lower brightness (e.g., one that would be expected to result in a completely dark (off) pixel) if the self-emissive elements were installed. White parts of the active array 52 represent display pixels that are programmed with a voltage corresponding to a higher brightness (e.g., a maximum brightness, gray level 255 (G255) for 8-bit image data) if the self-emissive elements were installed. A row 200 in FIGS. 14 and 15 represents a row that may be tested with the test patterns shown in those drawings to identify crosstalk.

Figure 16:
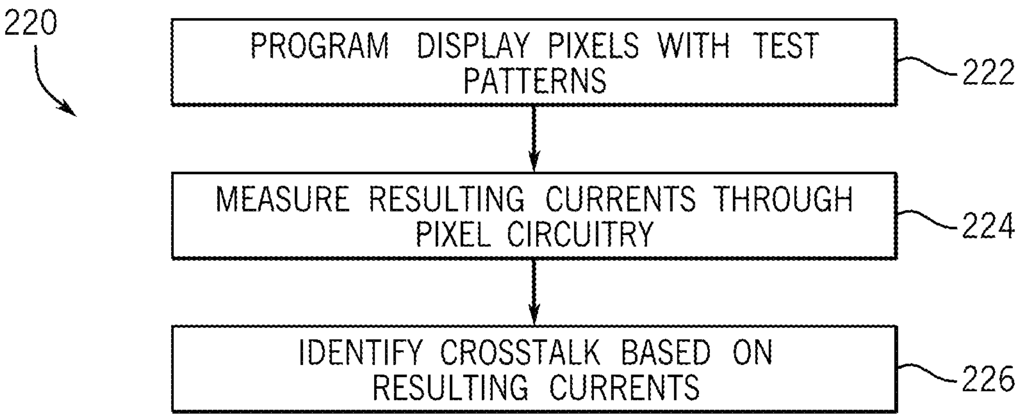
FIG. 16 is a flowchart of a method for identifying vertical crosstalk using electrical testing with the test architecture.

Indeed, as shown in a flowchart 220 of FIG. 16, vertical or horizontal crosstalk may be identified by programming display pixels with test patterns (block 222), measuring the resulting pixel currents as a result of the test patterns (block 224), and identifying, based on the resulting currents, an extent to which there is vertical or horizontal crosstalk (block 226). For the case of horizontal crosstalk, using patterns such as those shown in FIGS. 11 and 12, a single pixel may be tested or a column of pixels may be aggregated. For example, a pixel in (col x, row y), representing a bright (e.g., G255) pixel in a row where the pattern switches between FIGS. 11 and 12 may be measured to determine a change between these measurements. Based on the change (or lack of change), vertical crosstalk may be identified. For the case of horizontal crosstalk, pixel at a row of a particular column (e.g., Col2) where there is a transition from dark pixels to bright pixels may be tested. Based on the change (or lack of change), horizontal crosstalk may be identified. If vertical or horizontal crosstalk is identified, the display panel may be discarded without installing self-emissive elements or returned for repair before the self-emissive elements are installed.

Electrical Testing for Display Defect Screening

Figure 17:
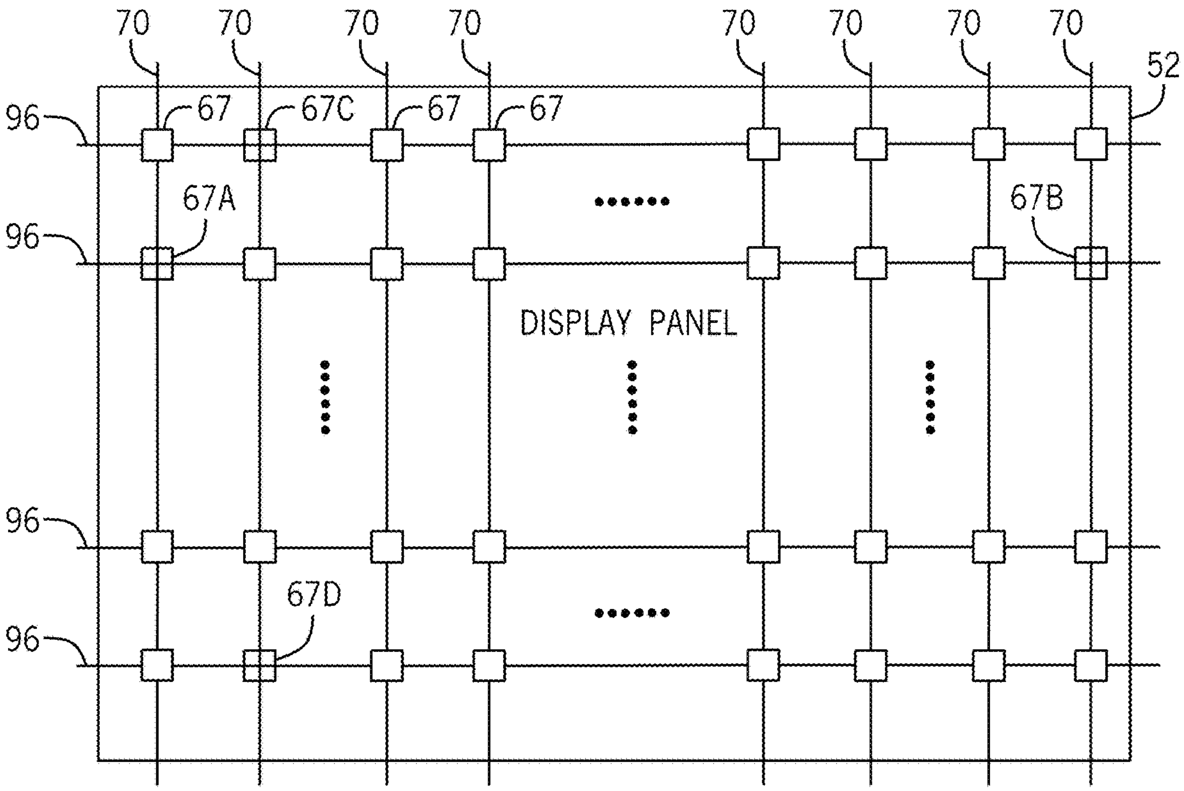
FIG. 17 is a flowchart of a method for identifying horizontal crosstalk using electrical testing with the test architecture.

Electrical testing is an effective way to screen the display panel. Electrical testing can be used as an augmentation, or as a replacement, to optical testing of the display. Electrical screening of some defects, such as horizontal or vertical scan lines or bright dot pixels, may be done before or after self-emissive elements are installed. FIG. 17 is used to illustrate several methods of display defect screening, showing display pixels 67 that may be programmed using vertical scan lines (e.g., data lines 70) when activated by horizontal scan lines (e.g., gate lines 96). As mentioned above, the display pixels 67 may be tested through anode reset lines 94 (not shown in FIG. 17).

Figure 18:
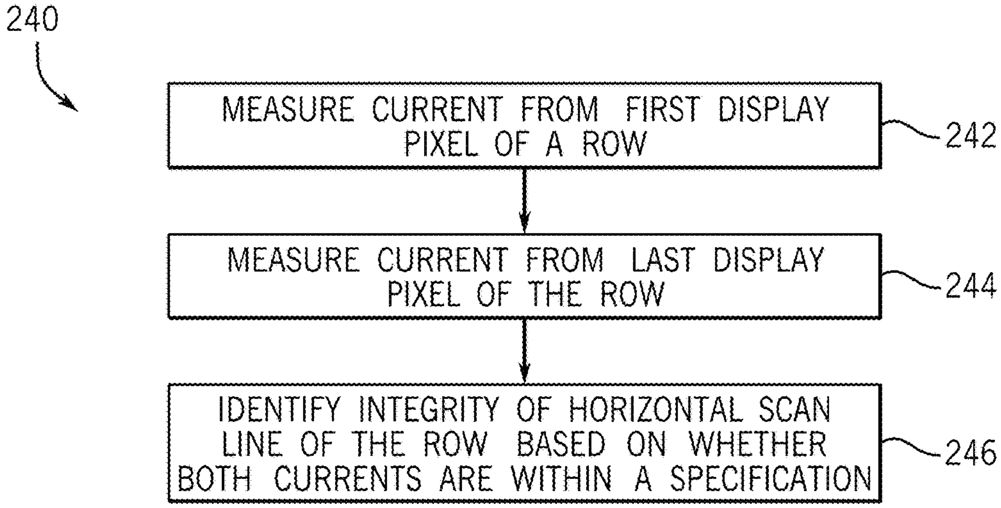
FIG. 18 is a block diagram illustrating electrical testing using the test architecture to perform display defect screening.

A flowchart 240 of FIG. 18 illustrates a method to perform a horizontal scan line integrity test. Current may be measured from a first display pixel of a row (e.g., display pixel 67A) (block 242) and from a last display pixel of a row (e.g., display pixel 67B) (block 244). If both currents are acceptable (e.g., within a threshold of an expected current) (block 246), this indicates that the horizontal scan line is not defective. However, there may be a defect somewhere along the horizontal scan line if one or both currents are not acceptable. Thus, even without testing every display pixel along the horizontal scan line, a potential defect in the horizontal scan line may be identified.

Figure 19:
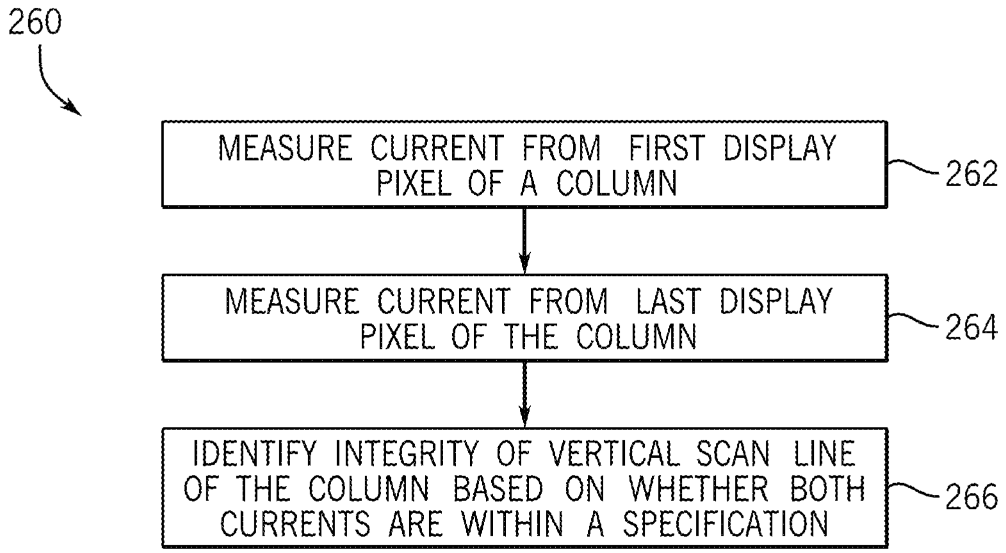
FIG. 19 is a flowchart of a method for performing an electrical scan line integrity test using the test architecture.

A flowchart 260 of FIG. 19 illustrates a method to perform a vertical scan line integrity test. Current may be measured from a first display pixel of a column (e.g., display pixel 67C) (block 262) and from a last display pixel of a column (e.g., display pixel 67D) (block 264). If both currents are within a threshold of an expected current (block 266), this indicates that the vertical scan line is not defective. However, there may be a defect somewhere along the vertical scan line if one or both currents are not within a threshold of an expected current. Thus, even without testing every display pixel along the vertical scan line, a potential defect in the vertical scan line may be identified.

Figure 20:
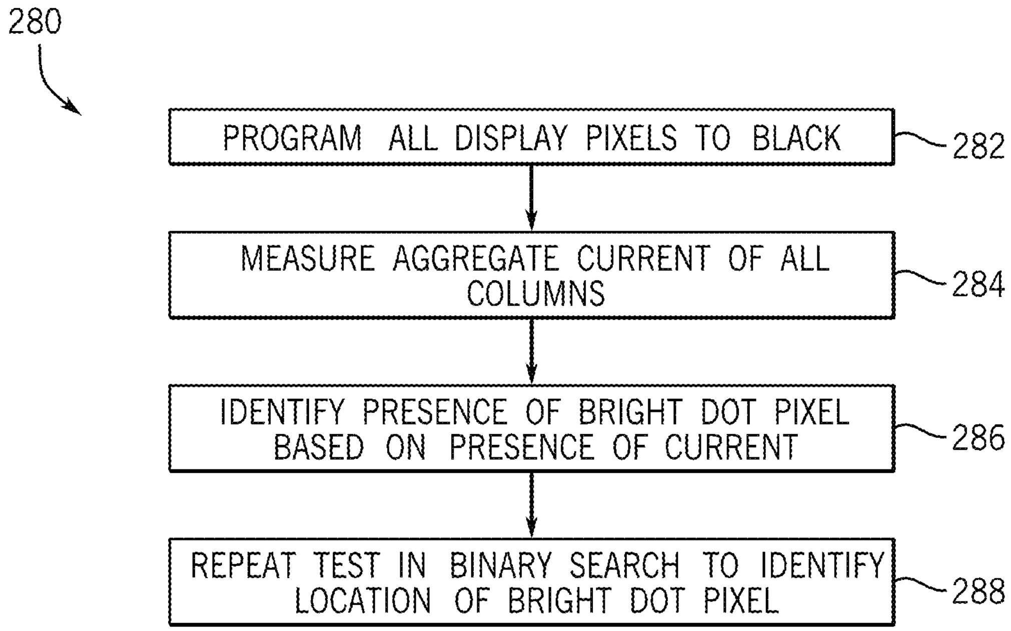
FIG. 20 is a flowchart of a method for performing an electrical display pixel bright dot test using the test architecture.

Another type of defect that may be detected electrically is a bright dot pixel. A bright dot pixel has pixel circuitry that may drive a self-emissive element to emit light even when the pixel is programmed to be off. Instead of, or in addition to, identifying a bright dot pixel in an optical test, a bright dot pixel may be identified using electrical screening. For example, as described by a flowchart 280 of FIG. 20, all display pixels may be programmed to display black (e.g., that would result in a completely dark (off) pixel if the self-emissive elements were installed) (block 282). The aggregate current of all columns may be measured (block 284). If there is any current from any pixel circuitry of the electronic display, this would be detectable from the aggregate current and thus may be used to identify the presence of a bright dot pixel (block 286). When it is determined that a bright dot pixel is located somewhere on the electronic display, the test may be repeated on a subset of the electronic display in a binary search pattern until the bright dot pixel is located (block 288). For example, when a bright dot pixel is identified as being present somewhere in the entire electronic display, the test may be repeated on just half of the electronic display to identify or rule out the presence of the bright dot pixel in that half, and so on until the bright dot pixel is located.

Other defects that may be detected through electrical screening are defects in the pixel circuitry of the display pixels. What is more, many of these defects may not be detected until a substantial amount of time has passed in an optical test. These defects thus may be referred to as "non-T0" defects, since they are not apparent at the outset of an optical test. Thus, it may be much more efficient to detect non-T0 defects electrically since. Indeed, even if the defects take a substantial amount of time to detect (e.g., on the order of minutes or hours), it may be comparatively inexpensive to detect these defects electrically because optical tests often involve a special test environment with high-resolution cameras.

Figure 21:
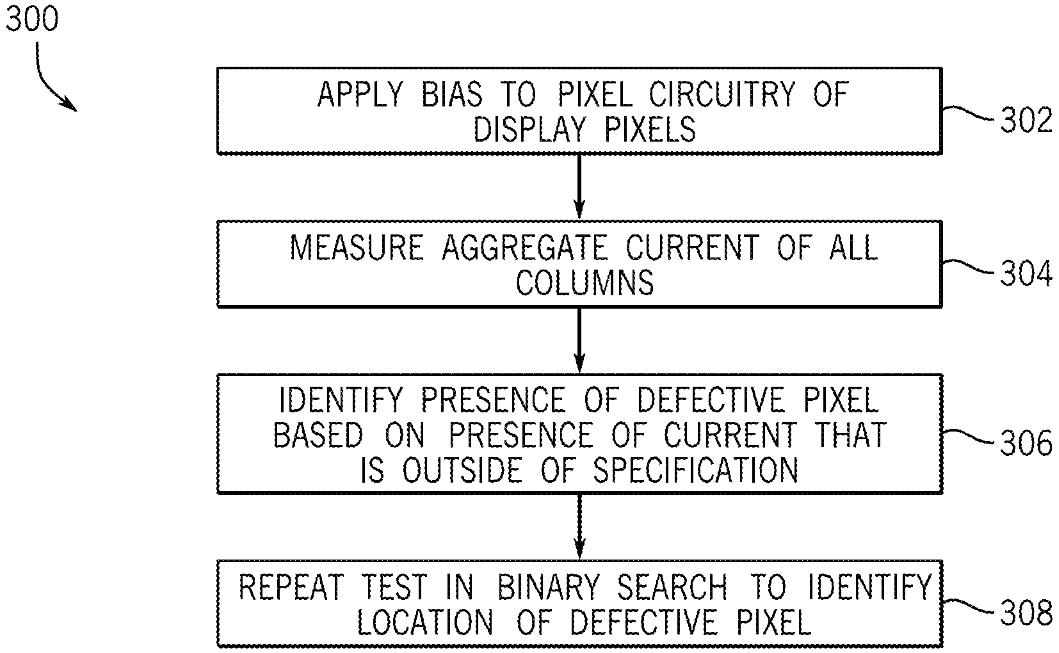
FIG. 21 is a flowchart of a method for detecting defective display pixels using the test architecture.

Thus, as provided by a flowchart 300 of FIG. 21, defective display pixels may be identified by applying a particular pattern of bias signals to the display pixels for some amount of time (block 302). Other stressors such as increased temperature may be applied to further increase the likelihood that a non-T0 defect may become detectable sooner. One set of biases that may be applied may include bias voltages applied to initialization voltage(s) on both sides of a storage capacitor connected to a data line. The biases may be un-applied, and further biases may be applied on the initialization voltage(s) and an emission voltage. The aggregate current of all columns may be measured immediately or after some period of time (e.g., on the order of seconds, minutes, or hours) (block 304). The presence of a defective display pixel may be identified based on the presence of a current that falls outside a specified value (e.g., outside of a threshold current value) (block 306). When it is determined that a defective display pixel is located somewhere on the electronic display, the test may be repeated on a subset of the electronic display in a binary search pattern until the defective display pixel is located (block 308). For example, if any column is detected with a current out of specification (e.g., an abnormally high current or an abnormally low current), current sensing within that column can be performed through binary search, until the exact row location of the defective display pixel can be identified.

Defective Line Detection

As mentioned above, some defects may not become detectable until the electronic display has been in use for some amount of time (e.g., a non-T0 defect). Indeed, some silicon defects inside peripheral circuits on display chip (e.g., source driver control gate contact/via open) could result in non-T0 line defect. These types of defects take a relatively long time of operational stress to activate before the defects can be observed optically. Therefore, an optical test may not be as efficient as an electrical test.

Figure 22:
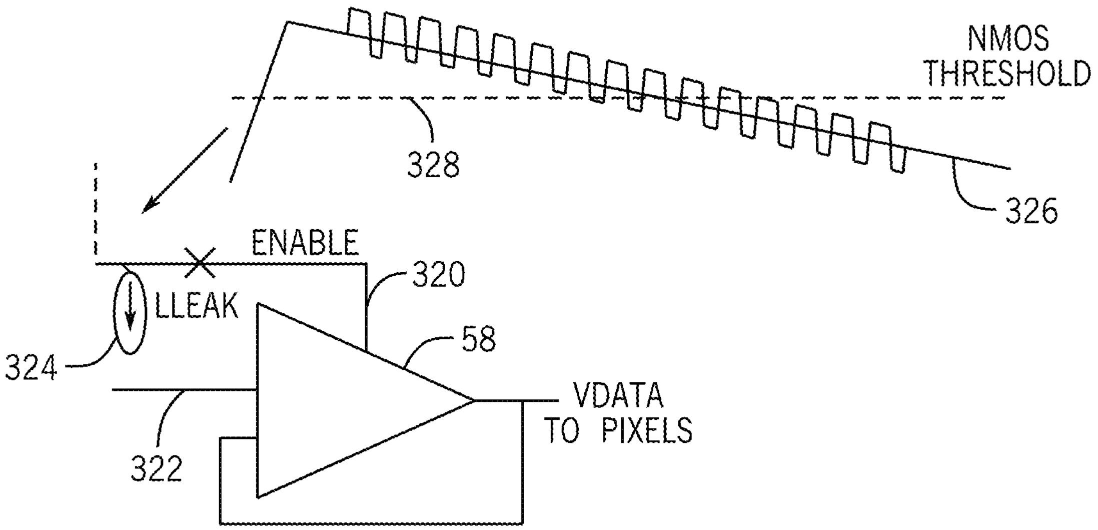
FIG. 22 is a circuit diagram illustrating a defect in line driver circuitry due to delayed failure of an enable line that may be detected using the test architecture.

One example of such a defect is shown in FIG. 22, which illustrates a defect that may affect a source driver 58. The source driver 58 may be enabled by an enable line 320 and may receive image data 322 that the source driver 58 amplifies and passes on to the display pixels. A gradually increasing current leak 324 may cause a voltage of the enable line 320 to gradually drop. Indeed, the voltage of the enable line 320 is shown by a curve 326 plotted over time from left to right. Although the curve 326 initially starts above an NMOS threshold and therefore allows the source amplifier to operate, after some amount of time, the curve 326 drops below the NMOS threshold. Thus, the enable line is effectively turned off after some amount of time.

Figure 23:
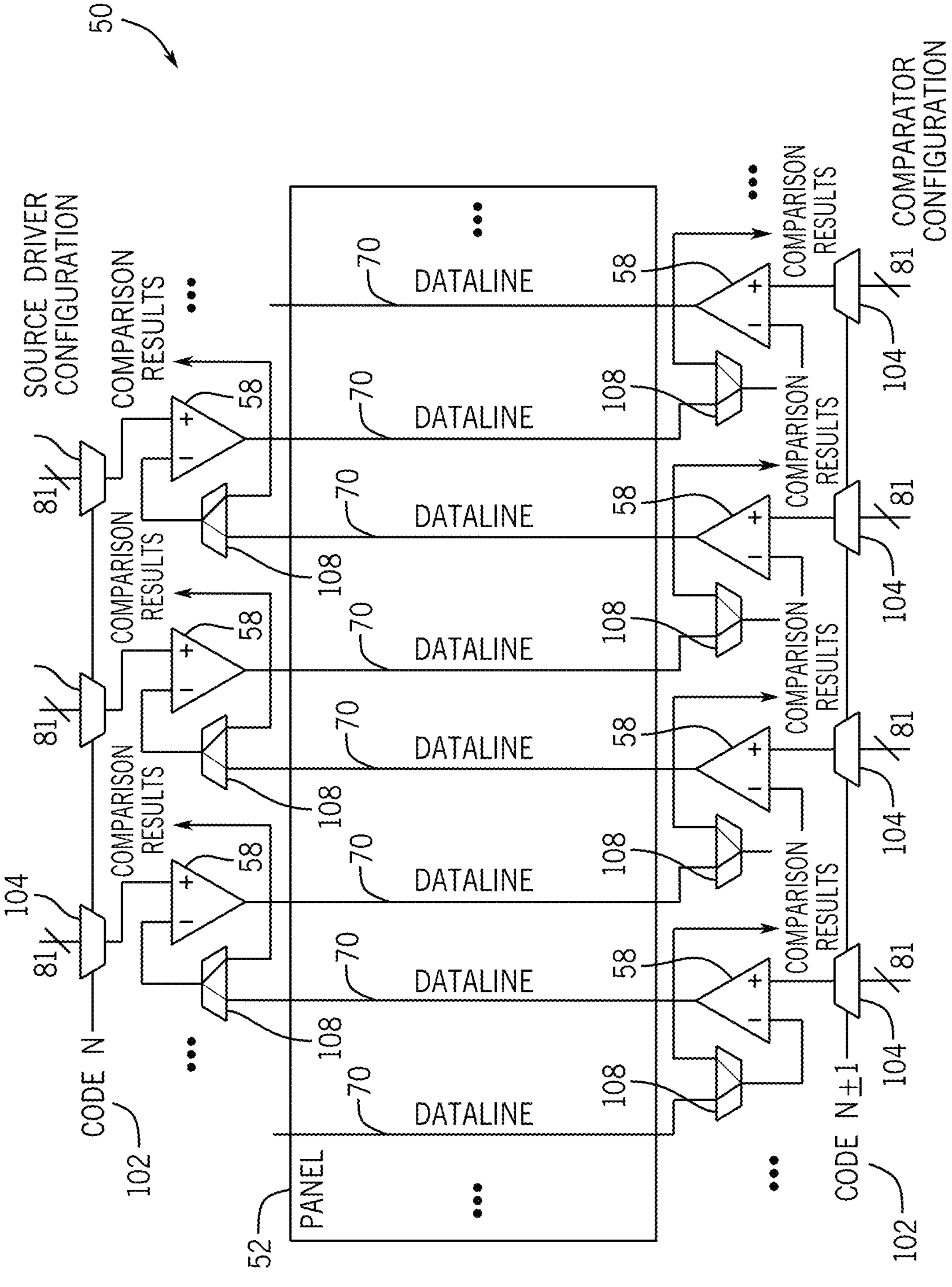
FIG. 23 is a block diagram illustrating the use of the test architecture to identify a defect in line driver circuitry.
Figure 24:
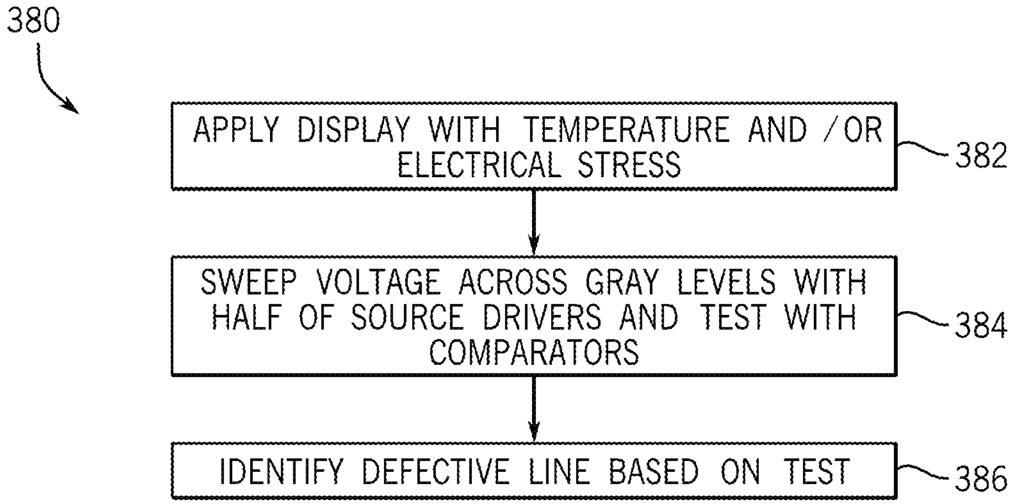
FIG. 24 is a flowchart of a method for identifying a defect in line driver circuitry using the test architecture.

The architecture of the system 50 may be used to identify a defective data line 70 due to a non-T0 defect, as shown by FIG. 23. FIG. 23 has a structure similar to FIG. 8 except that the electrical values on each data line 70 are compared to a different, next adjacent data line 70. A defective data line 70 due to a non-T0 defect in a source driver 58 may be detected according to a flowchart 380 of FIG. 24. The display may be applied with stress such as bias voltages or an elevated temperature (block 382). Voltages may be swept across a range of gray levels using half of the source drivers 58 (e.g., the upper source drivers 58 or the lower source drivers 58) (block 384). Based on the comparison, a defective line may be identified (block 386). For example, if one source driver 58 is found not to be supplying a voltage despite being operated to do so after some period of time, this suggests that the source driver 58 may have a non-T0 defect. The method of the flowchart 380 of FIG. 24 may be repeated to test the other half of the source drivers 58.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. § 112(f). However, for any claims containing elements designated in any other manner, it is intended that such elements are not to be interpreted under 35 U.S.C. § 112(f).

What is claimed is:

1. A system comprising:

an electronic display comprising:

an anode reset switch, wherein the anode reset switch is configured to couple anodes of self-emissive elements of selected display pixels to a test signal; and a source driver coupled to test circuitry, via a test bus, wherein the source driver is configured to supply the test signal; and a testing device configured to measure an aggregate current out of cathodes of the self-emissive elements of the selected display pixels that results due to the test signal to enable a current-voltage (IV) characterization of the self-emissive elements of the selected display pixels.

2. The system of claim 1, wherein the selected display pixels comprise a plurality of rows of display pixels of the electronic display representing fewer than all rows of the electronic display.

3. The system of claim 2, wherein the electronic display is configured to supply the test signal over an anode reset line of the electronic display.

4. The system of claim 3, wherein the testing device is configured to change a number of rows under test based on a plurality of test voltages being applied.

5. The system of claim 1, wherein the electronic display is configured to supply a plurality of test signals.

6. The system of claim 5, wherein the selected display pixels comprise a first plurality of rows of display pixels of the electronic display when a first test signal of the plurality of test signals is supplied and a second plurality of rows of display pixels of the electronic display when a second test signal of the plurality of test signals is supplied.

7. A method comprising:

programming display pixels of an electronic display with a plurality of test patterns;

measuring resulting currents through pixel circuitry of the display pixels using test circuitry disposed in the electronic display, wherein the test circuitry is configured to couple, via a test bus, to one or more source drivers of the electronic display; and identifying a presence or an absence of vertical or horizontal cross talk based on the measurements.

8. The method of claim 7, comprising determining to discard the electronic display in response to identifying the presence of the vertical or horizontal cross talk based on the measurements.

9. The method of claim 7, comprising sensing a pixel current from a pixel, a row of pixels, or a column of pixels based on reset lines coupled to the test circuitry.

10. The method of claim 9, comprising:

determining if the measurements are within an expected threshold; and indicating that a panel of the electronic display is ready to proceed to self-emissive element installation.

11. The method of claim 9, comprising:

determining if the measurements are outside an expected threshold; and indicating that a panel of the electronic display is not ready to proceed to self-emissive element installation.

12. A method comprising:

measuring display pixel currents associated with at least two display pixels of an electronic display using electrical test circuitry disposed in the electronic display, wherein the electrical test circuitry is configured to couple, via a test bus, to one or more source drivers of the electronic display; and identifying a defect of the electronic display based on the measured display pixel currents.

13. The method of claim 12, wherein:

the at least two display pixels comprise a first display pixel of a row and a last display pixel of the row; and identifying the defect comprises identifying an integrity of a horizontal scan line based on whether the measured display pixel currents of the at least two display pixels fall within a specification.

14. The method of claim 12, comprising programming all display pixels of the electronic display to display black; wherein:

the at least two display pixels comprise all the display pixels of the electronic display; and identifying the defect comprises identifying a presence of a bright dot pixel defect based on whether the measured display pixel currents of the at least two display pixels are nonzero.

15. The method of claim 14, comprising repeating the programming, measuring, and identifying in a binary search pattern in response to identifying the presence of the bright dot pixel defect.

16. The method of claim 12, wherein the method is performed before any self-emissive elements are installed on the electronic display.

17. The method of claim 16, comprising, based on identifying the defect, indicating that a panel of the electronic display is not ready to proceed to self-emissive element installation.

18. The method of claim 17, comprising sensing a pixel current from a pixel, a row of pixels, or a column of pixels based on reset lines coupled to the electrical test circuitry.

19. A method comprising:

applying a bias or stress, or both, to display pixels of an electronic display;

measuring an aggregate current of all columns of the display pixels using test circuitry disposed in the electronic display, wherein the test circuitry is configured to couple, via a test bus, to one or more source drivers of the electronic display; and identifying a presence or absence of a defective pixel based on a presence of a current that is outside of a specification.

20. The method of claim 19, wherein the method is performed before any self-emissive elements are installed on the electronic display.

21. The method of claim 20, comprising, based on identifying the presence of the defective pixel, indicating that a panel of the electronic display is not ready to proceed to self-emissive element installation.

22. The method of claim 21, comprising sensing a pixel current from a pixel, a row of pixels, or a column of pixels based on reset lines coupled to the test circuitry.

23. A method comprising:

providing an enable signal to a source driver connected to a data line of an electronic display;

testing the data line using test circuitry integral to the electronic display, wherein the test circuitry is configured to couple, via a test bus, to the source driver, and wherein testing the data line comprises measuring a voltage from the source driver on the data line that changes over time; and identifying that the source driver has a non-T0 defect in response to measuring substantially zero voltage after previously measuring a nonzero voltage.

24. The method of claim 23, comprising, based on comparing the voltage to thresholds, indicating that a panel of the electronic display is ready to proceed to self-emissive element installation.

25. The method of claim 23, comprising, based on identifying the non-T0 defect, indicating that a panel of the electronic display is not ready to proceed to self-emissive element installation.

* * * * *